(12) United States Patent
Onishi et al.

(10) Patent No.: US 8,829,087 B2
(45) Date of Patent: Sep. 9, 2014

(54) TRANSPARENT LAYER FORMING POLYMER

(75) Inventors: Osamu Onishi, Tokyo (JP); Larry F. Rhodes, Silver Lake, OH (US); Nobuo Tagashira, Tokyo (JP)

(73) Assignees: Promerus, LLC, Brecksville, OH (US); Sumitomo Bakelite Co., Ltd., Tokyo (JP)

( * ) Notice: Subject to any disclaimer, the term of this patent is extended or adjusted under 35 U.S.C. 154(b) by 233 days.

(21) Appl. No.: 13/315,404

(22) Filed: Dec. 9, 2011

(65) Prior Publication Data

US 2012/0149815 A1 Jun. 14, 2012

Related U.S. Application Data

(60) Provisional application No. 61/422,763, filed on Dec. 14, 2010.

(51) Int. Cl.
*C08K 5/526* (2006.01)
*C08K 5/07* (2006.01)
*C08L 45/00* (2006.01)
*C08F 232/04* (2006.01)
*C08F 232/08* (2006.01)
*G03F 7/038* (2006.01)
*C08F 4/80* (2006.01)

(52) U.S. Cl.
CPC .............. *C08F 232/08* (2013.01); *G03F 7/038* (2013.01)

USPC ........... 524/128; 524/364; 524/544; 524/546; 524/553; 526/245; 526/246; 526/247; 526/250; 526/253; 526/273; 526/281

(58) Field of Classification Search
USPC ......... 526/253, 268, 281, 245, 247, 254, 250, 526/273, 246; 524/128, 151, 546, 553, 364, 524/544
See application file for complete search history.

(56) References Cited

U.S. PATENT DOCUMENTS

| | | | |
|---|---|---|---|
| 6,677,175 B2 | 1/2004 | Zhao et al. | |
| 7,022,790 B2 * | 4/2006 | Elce et al. | ...................... 526/281 |
| 7,361,931 B2 | 4/2008 | Yamazaki | |
| 7,524,594 B2 * | 4/2009 | Amoroso et al. | ................ 430/18 |
| 2010/0062378 A1 | 3/2010 | Choki et al. | |

FOREIGN PATENT DOCUMENTS

EP  1771491 B1  4/2007

\* cited by examiner

*Primary Examiner* — Fred M Teskin
(74) *Attorney, Agent, or Firm* — Balaram Gupta

(57) ABSTRACT

Embodiments in accordance with the present invention provide polymers for forming layers/films useful in the manufacture of a variety of types of optoelectronic displays. Such embodiments also provide compositions of such polymers for forming such layers/films where the formed layers/films have high transparency over the visible light spectrum.

22 Claims, No Drawings

TRANSPARENT LAYER FORMING POLYMER

CROSS-REFERENCED TO RELATED APPLICATION

This application claims the benefit of U. S. Provisional Application No. 61/422,763, filed Dec. 14, 2010, which is incorporated herein by reference in its entirety.

TECHNICAL FIELD

Embodiments disclosed hereinbelow relate generally to polymers for forming layers/films useful in the manufacture of a variety of types of displays and more specifically norbornene-type polymers and compositions thereof for forming such layers/films having high transparency over the visible light spectrum.

BACKGROUND

In the manufacture of liquid crystal displays, organic light emitting diode displays and other optoelectronic devices, there is a need for the forming of a number of different transparent organic and inorganic layers. For example, LCDs typically encompass color filter layers, polarizing layers, leveling layers, scratch preventative layers and the like. As the manufacturing processes for such displays continues to evolve, the materials that are used for such layers often must also evolve or change to meet more demanding requirements resulting from the aforementioned evolution. Therefore a need exists for transparent layers which can meet such evolved requirements.

DETAILED DESCRIPTION

Exemplary embodiments in accordance with the present disclosure will be described with reference to the Examples and Claims provided hereinafter. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope and spirit of the present invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

As used herein, molecular weight values of polymers, such as weight average molecular weights (Mw) and number average molecular weights (Mn), are determined by gel permeation chromatography using polystyrene standards.

As used herein, and unless otherwise stated, where polymer glass transition temperature (Tg) values are provided, they were determined by differential scanning calorimetry in accordance with American Society for Testing and Materials (ASTM) method number D3418.

As used herein, and unless otherwise stated, where polymer decomposition temperatures ($T_d$) are provided, they will be understood to be the temperature, determined by thermogravimetric analysis at a heating rate of 10° C./minute under nitrogen, where a specific weight percent (wt %) of a polymer has determined to have decomposed (lost by vaporization). The terms $T_{d1}$, $T_{d5}$, $T_{d50}$ and $T_{d95}$ indicate the temperatures at which 1 wt %, 5 wt %, 50 wt % and 95 wt % of the polymer has decomposed.

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10.

As used herein, the phrases "transparent polymer", "transparent layer" or "transparent film" will be understood to mean a polymer, layer or film that is essentially transparent to radiation in the range of 400 nm to 750 nm (the visible light range). That is to say that such a transparent polymer or transparent layer will allow at least 95% transmission of visible light in the aforementioned range to pass therethrough. While transmission over the entire visible spectrum is mentioned herein, the actual measurement of % transmission is performed at 400 nm as transmission of light at the low end of the visible spectrum is generally more problematic than higher wavelengths.

As used herein, "hydrocarbyl" refers to a hydrocarbon a group that contains only carbon and hydrogen, non-limiting examples being alkyl, cycloalkyl, alkenyl, cycloalkenyl, alkynyl, aryl, aralkyl and alkaryl.

As used herein, the terms "alkyl" and "cycloalkyl" refer, respectively, to acyclic or cyclic saturated hydrocarbyls having an appropriate carbon chain length from $C_1$ to $C_{25}$. Non-limiting examples of suitable alkyl groups include, but are not limited to, $-CH_3$, $-(CH_2)_3CH_3$, $-(CH_2)_4CH_3$, $-(CH_2)_5CH_3$, $-(CH_2)_9CH_3$, $-(CH_2)_{23}CH_3$, cyclopentyl, methylcyclopentyl, cyclohexyl and methylcyclohexyl.

As used herein the terms "alkenyl" and "cycloalkenyl" refer, respectively, to acyclic or cyclic saturated hydrocarbon groups having at least one carbon to carbon double bond and an appropriate carbon chain length of from $C_2$ to $C_{25}$. Non-limiting examples include, among others, vinyl groups and groups derived from propylene, butene, cyclopentene, cyclohexane and isopropylprenyl.

As used herein the term "aryl" refers to aromatic hydrocarbyls that include, without limitation, groups such as phenyl, biphenyl, benzyl and xylyl.

The terms "alkaryl" or "aralkyl" are used herein interchangeably and refer to an aromatic hydrocarbyl substituted with at least one alkyl, cycloalkyl, alkenyl or cycloalkenyl group, for example, groups derived from toluene, butylbenzene, cyclohexylbenzene and 1,2-dihydro-1,1'-biphenyl.

As used herein, "halohydrocarbyl" refers to any of the previously described hydrocarbyl groups where at least one hydrogen has been replaced by a halogen and "perhalocarbyl" refers to such a hydrocarbyl group where all hydrogens have been replaced by a halogen, e.g. pentafluorobenzene, respectively.

As used herein the term "heterohydrocarbyl" refers to any of the previously described hydrocarbyl groups where at least one of the carbon atoms is replaced with N, O, S, Si or P. Non-limiting examples include heterocyclic aromatic groups such as pyrrolyl, furanyl, and pyridenyl as well as non-aromatic groups such as epoxies, alcohols, ethers, thioethers and silyl ethers.

Additionally, it will be understood that the term "hydrocarbyl" is a generic term inclusive of the more specific terms halohydrocarbyl, perhalohydrocarbyl and heterohydrocarbyl. Further, it will be understood that any of such moieties can be further substituted and where appropriate, in terms of the number of carbon atoms, linear, branched or cyclic. Non-limiting examples of suitable substituent groups include, among others, hydroxyl groups, epoxy groups, benzyl groups, carboxylic acid and carboxylic acid ester groups, amides and imides. Still further, it will be understood that the term "hydrocarbylene" refers to a divalent radical formed by removing a hydrogen atom from any of the aforementioned hydrocarbyls.

The term "norbornene-type" is used herein to mean a monomer in accordance with Structure 1 shown below, or a polymeric material that was formed from at least one such norbornene-type monomer and therefore has at least one repeat unit in accordance with Structure 2, also shown below:

1

2

It will be understood that where various compounds are described as monomers and/or polymerizable monomers, that such compounds are structurally analogous to Structure 1, above. That is to say, such compounds have a polymerizable double bond as shown in 1 above. It will also be understood, that when such monomers are polymerized, they are incorporated into a polymer structure as "repeat units" or "repeating units" that are structurally analogous to Structure 2, above. That is to say that, the polymerization occurs across the double bond of Structure 1 as shown in Structure 2 and the resulting polymer is generally referred to as a vinyl addition polymer.

Further, the term norbornene-type monomer is used herein to mean, in addition to norbornene itself, any substituted norbornene(s), or substituted and unsubstituted higher cyclic derivatives thereof. Formulae A1 and A2, shown below, are representative of such norbornene-type monomers and the norbornene-type repeating units derived from such monomers, respectively:

A1

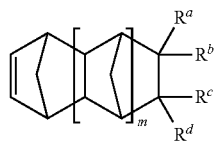

A2

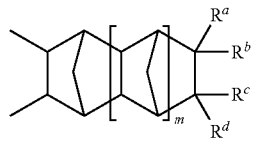

where m is 0, 1 or 2 and each occurrence of $R^a$, $R^b$, $R^c$ and $R^d$ independently represents hydrogen, a hydrocarbyl or another substituent. It should be noted that in deriving a repeating unit represented by Formula A2 from a monomer represented by Formula A1, the substitution and nature of any of $R^a$, $R^b$, $R^c$ and $R^d$ is unmodified; thus it can be said that repeating units of polymer embodiments of the present disclosure are unmodified repeating units.

Embodiments in accordance with the present disclosure are directed to norbornene-type polymers, compositions that encompass such polymers and methods that utilize such polymer compositions to form a transparent polymer layer or film having a pencil hardness of 4 H or higher, that retains at least 95% of its initial transparency at 400 nm after exposure in air to a temperature of 280° C. for 30 min; that exhibits a high degree of thermal stability in that the percent weight loss of such film does not exceed 1% during exposure, in air, to a temperature of 280° C. for 30 min and that exhibits no more than a 2% change in film thickness (for a 3 um film) after soaking in N-Methyl-2-pyrrolidone (NMP) at 40° C. for 10 min.

It has been found that the aforementioned norbornene-type polymers encompass at least two distinct types of monomers that are in accordance with Formula A1. That is to say, a first type of norbornene-type monomer encompassing a crosslinkable hydrocarbyl pendent group and a second type of norbornene-type monomer encompassing a hydrocarbyl group selected to provide, among other things, the desired high transparency over the visible light spectrum to the resulting polymer.

For said first type of monomer, at least one of $R^a$, $R^b$, $R^c$, and $R^d$ is a hydrocarbyl group in accordance with one of Formulae B, C or D:

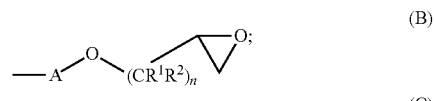

(B)

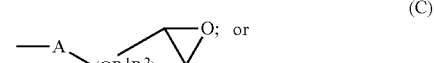

(C)

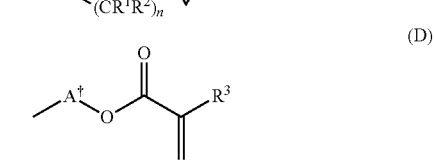

(D)

where in each of Formulae B and C, n is an integer from 1 to 4; A, if present, is a hydrocarbyl linking group selected from methylene, or a $C_2$ to $C_6$ alkylene and $R^1$ and $R^2$ are each independently selected from hydrogen, fluorine, methyl, perfluromethyl, ethyl or perfluoroethyl. Non-limiting examples of suitable hydrocarbyl linking groups A, include methylene, ethylene, propylene, isopropylene, butylene, isobutylene and hexylene. Non-limiting examples of useful glycidyl alkyl ether pendent groups in accordance with Formula B include, but are not limited, to glycidyl methyl ether, glycidyl ethyl ether, glycidyl propyl ether, glycidyl isopropyl ether, glycidyl butyl ether, glycidyl isobutyl ether, glycidyl hexyl ether. Non-limiting examples of useful alkyl epoxy pendent groups in accordance with Formula C include, but are not limited, butyl epoxy, pentyl epoxy, hexyl epoxy and octyl epoxy.

For Formula D, $A^\dagger$, if present, is a linking group selected from methylene, or a $C_2$ to $C_6$ alkylene or ether, $R^3$ represents hydrogen, methyl, a $C_2$-$C_4$ hydrocarbyl, a nitrile (CN), a $C_1$-$C_3$ perfluorohydrocarbyl or a halogen (F, Cl, Br). Representative perfluorohydrocarbyls include but are not limited to perfluoromethyl and perfluoroethyl.

For said second type of monomer, at least one of $R^a$, $R^b$, $R^c$, and $R^d$ is hydrocarbyl group in accordance with one of Formulae E, F, G, or H:

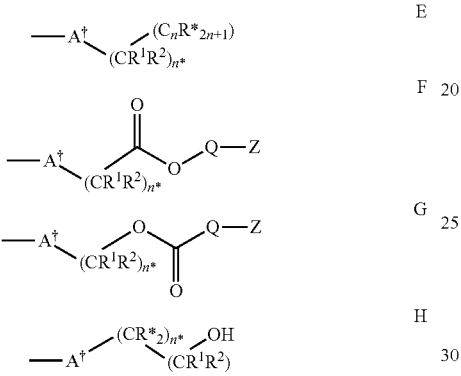

where $A^\dagger$, if present, is as defined above; n is an integer from 1 to 6, n* is an integer from 0 to 3, each R* independently represents hydrogen or fluorine, $R^1$ and $R^2$ are each independently selected from hydrogen, fluorine, methyl, perfluromethyl, ethyl or perfluoroethyl. Non-limiting examples of suitable pendent groups in accordance with Formula E include, but are not limited to, $C_3$ to $C_{10}$ alkyl and perfluroalkyl hydrocarbyl groups such as -$A^\dagger$-$C_4F_9$ or -$A^\dagger$-$C_6F_{13}$. Non-limiting examples of suitable pendent groups in accordance with Formulae F and G include, but are not limited to, $C_1$ to $C_6$ acetates and carboxylates, respectively, where Q, if present, is selected from a $C_2$ to $C_9$ alkylene and Z is selected from one of ($C_nR^*_{2n+1}$) or $(CR^*_2)_n(CR^1R^2)_n$OH. Exemplary acetates and carboxylates include, among others, -$A^\dagger$-$CH_2$—C(O)$OC_2H_5$, -$A^\dagger$-C($CF_3$)$_2$—C(O)$OC_4H_9$, -$A^\dagger$-$CH_2$—OC(O)$CH_3$ or -$A^\dagger$-C($CF_3$)$_2$—OC(O)$C_4H_9$. Non-limiting examples of suitable pendent groups in accordance with Formula H include, but are not limited to, $C_3$ to $C_{10}$ alcohols, acetals and ether-alcohols such as —$CH_2$—O—$CH_2$—C($CF_3$)$_2$—OH (where n* is 0, $A^\dagger$ is —$CH_2$—O—$CH_2$— and each of $R^1$ and $R^2$ is perfluoromethyl) or —$CH_2$—C($CF_3$)$_2$—OH (where n* is 0, $A^\dagger$ is —$CH_2$— and each of $R^1$ and $R^2$ is perfluoromethyl).

Exemplary first type monomer embodiments in accordance with the present disclosure include, but are not limited to:

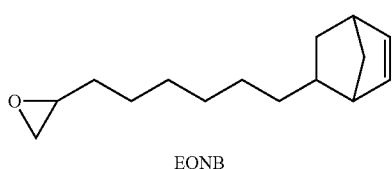

EONB

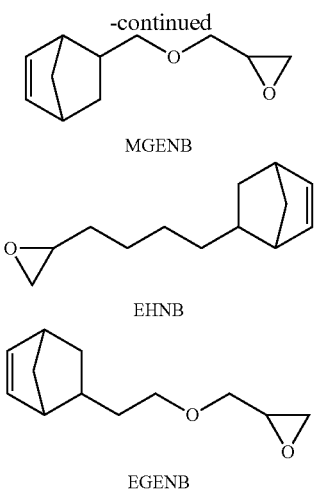

Exemplary second type monomer embodiments in accordance with the present disclosure include, but are not limited to:

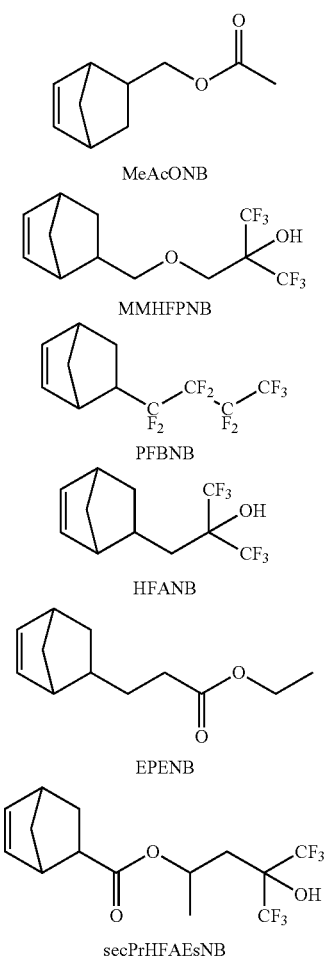

For ease of understanding, the chemical names and related acronyms for each of the four exemplary first type monomer embodiments and each of the six exemplary second type monomers are provided below. 2-(6-(bicyclo[2.2.1]hept-5-en-2-yl)hexyl)oxirane (EONB), 2-((2-(bicyclo[2.2.1]hept-5- en-2-yl)methoxy)methyl)oxirane (MGENB), 2-(6-(bicyclo[2.2.1]hept-5-en-2-yl)butyl)oxirane (EHNB), 2-((2-(bicyclo[2.2.1]hept-5-en-2-yl)ethoxy)methyl)oxirane (EGENB), bicyclo[2.2.1]hept-5-en-2-ylmethyl acetate (MeAcONB), 2-((2-(bicyclo[2.2.1]hept-5-en-2-yl)methoxy)-1,1,1,3,3,3-hexafluoro-2-methylpropan-2-ol (MMHFPNB), 5-(perfluorobutyl)bicyclo[2.2.1]hept-2-ene (PFBNB), 2-(bicyclo[2.2.1]hept-5-en-2-ylmethyl)-1,1,1,3,3,3-hexafluoropropan-2-ol (HFANB), ethyl 3-(bicyclo[2.2.1]hept-5-en-2-yl)propanoate (EPENB) and 5,5,5-trifluoro-4-hydroxy-4-(trifluoromethyl)pentan-2-yl bicyclo[2.2.1]hept-5-ene-2-carboxylate (secPrHFAEsNB).

As previously mentioned, embodiments in accordance with the present disclosure are directed to norbornene-type layer forming polymers, compositions that encompass such polymers and methods that utilize such polymer compositions to form a transparent polymer layer. It will therefore be understood that such norbornene-type layer forming polymer embodiments are formed via 2, 3 enchainment of at least one of said first type of monomer and at least one of said second type of monomer as are exemplified by Examples 1 through 6, presented below as non-limiting representations of some polymer embodiments in accordance with the present disclosure.

Further, it will be understood, that the layer forming compositions in accordance with the present disclosure encompass one of more layer forming polymer embodiments, a casting solvent and one or more additives. Such layer forming composition embodiments are exemplified by Examples 7 through 12, presented below as non-limiting representations of some polymer composition embodiments in accordance with the present disclosure.

With regard to the aforementioned casting solvents of such polymer composition embodiments, such casting solvents include, but are not limited to, N-methylpyrrolidone (NMP), Gamma-Butyrolactone (GBL), N,N-dimethylacetamide (DMA), dimethyl sulfoxide (DMSO), diethylene glycol dimethyl ether, diethylene glycol dibutyl ether, propylene glycol monomethyl ether (PGME), propylene glycol monomethyl ether acetate (PGMEA), methyl lactate, ethyl lactate, butyl lactate, methyl ethyl ketone (MEK), methyl amyl ketone (MAK), cyclohexanone and mixtures thereof.

With regard to the aforementioned additives of such polymer conipostion embodiments, such additives include, but are not limited to, thermal acid generators (TAGs), antioxidants and synergists where exemplary TAGs include, among others, SI-45L, SI-60L, SI-80L, SI-100L, SI-110L, SI-150L, SI-145L, 150 and 160 manufactured by SANSHIN CHEMICAL INDUSTRY CO., LTD.; and ADEKAOPTON CP-77 and CP-66 manufactured by ADEKA CORPORATION, where SI-150L, is dimethyl(p-acetoxyphenyl)sulfonium hexafluoroantimonate, CAS No. 135691-31-5, SL-100L is benzyl(p-hydrozyphenyl)methylsulfonium hexafluoroantimonate, CAS No. 125662-42-2and SI-60L is 1-naphthyl(p-hydroxyphenyl)methylsulfonium hexafluoroantimonate, CAS No. 133152-67-7.

With regard to antioxidants/synergists, the trade names of exemplary materials include, among others, ADK STAB AO-20 (1,3,5-tris(3,5-di-tert-butyl-4-hydroxybenzyl)-1,3,5-triazinane-2,4,6-trione, CAS No. 27676-62-6), ADK STAB AO-30 (4,4',4"-(butane-1,1,3-triyl)tris(2-(tert-butyl)-5-methylphenol), CAS No. 1843-03-4), ADK STAB AO-40 (4,4'-(butane-1 1-diyl)bis(2-(tert-butyl)-5-methylphenol), CAS No. 85-60-9), ADK STAB AO-50 (octadecyl 3-(3,5-di-tert-butyl-4-hydroxyphenyl)propionate, CAS No. 2082-79-3), ADK STAB AO-60(pentaerythritol tetrakis(3-(3,5-di-tert-butyl-4-hydroxyphenyl)propionate), also known as, tetrakis [methylene 3-(3',5'-di-t-butyl-4-hydroxyphenyl) propionate] methane, CAS No. 6683-19-8), ADK STAB AO-80 (2,4,8,10-tetraoxaspiro[5.5]undecane-3,9-diylbis(2-methylpropane-2,1-diyl) bis(3-(3-(tert-butyl)-4-hydroxy-5-methylphenyl)propanoate), CAS No. 90498-90-1), ADK STAB AO-330 (3,3",5,5"-tetra-tert-butyl-5'-(3,5-di-tert-butyl-4-hydroxyphenyl)-2',4',6'-trimethyl-[1,1':3',1"-terphenyl]-4,4"-diol, CAS No. 1709-70-2), Sumilizer GM (2-tert-butyl-6-(3-tert-butyl-2-hydroxy-5-methylbenzyl)-4-methylphenyl acrylate, CAS No. 61167-58-6, Sumilizer GS(2-[1-(2-hydroxy-3, 5-di-tert-pentylphenyl)ethyl]-4, 6-di-tert-pentylphenyl acrylate, CAS No. 123968-25-2), Sumilizer GA-80 (3,9-bis[2-[3-(3-tert-butyl-4-hydroxy-5-methylphenyl)propionyloxy]-1,1-dimethylethyl]-2,4,8,10-tetraoxaspirof[5.5]undecane, CAS No. 90498-90-1), Sumilizer MDP-S (2,2'-methylenebis(6-tert-butyl-4-methylphenol), CAS No. 119-47-1), Sumilizer BBM-S (4,4'-butylidenebis(6-tert-butyl-3-methylphenol), CAS No. 85-60-9), Sumilizer WX-R (4,4'-thiobis(6-tert-butyl-3-methylphenol), CAS No. 96-69-5), IRGANOX 1010 (pentaerythritol tetrakis(3-(3,5-di-tert-butyl-4-hydroxyphenyl)propionate), also known as, tetrakis[methylene 3-(3',5'-di-t-butyl-4-hydroxyphenyl) propionate]methane, CAS No. 6683-19-8), IRGANOX 1035(thiodiethylene bis[3-(3,5-di-tert.-butyl-4-hydroxy-phenyl)propionate], CAS No. 41484-35-9, IRGANOX 1076 (octadecyl-3-(3,5-di-tert.butyl-4-hydroxyphenyl)-propionate, CAS No. 2082-79-3), IRGANOX 1098 (N,N'-hexane-1,6-diylbis(3-(3,5-di-tert.-butyl-4-hydroxyphenylpropionamide)), CAS No. 23128-74-7), IRGANOX 1135 (benzenepropanoic acid, 3,5-bis(1,1-dimethylethyl)-4-hydroxy-$C_7$-$C_9$ branched alkyl esters, CAS No. 125643-61-0), IRGANOX 1330 (1,3,5-trimethyl-2,4,6-tris(3,5-di-t-butyl-4-hydroxybenzyl) benzene, CAS No. 1709-70-2), IRGANOX 1726 (4,6-bis(dodecylthiomethyl)-o-cresol, CAS No. 110675-26-8), IRGANOX 1425 (calcium phosphonate), IRGANOX 1520 (2-methyl-4,6-bis(octylsulfanylmethyl)-phenol, CAS No. 110553-27-0), IRGANOX 245 (triethylene glycol bis(3-tert-butyl-4-hydroxy-5-methylphenyl)propionate, CAS No. 36443-68-2), IRGANOX 259 (1,6-hexamethylene bis(3,5-di-(tert)-butyl-4-hydroxyhydrocinnamate), CAS No. 35074-77-2), IRGANOX 3114 (1,3,5-tris(3,5-di-tert-butyl-4-hydroxybenzyl)-1,3,5-triazine-2,4,6 (1H, 3H, 5H)-trione, CAS No. 27676-62-6), IRGANOX 565 (2,6-di-tert-butyl-4-(4,6-bis(octylthio)-1,3,5-triazin-2-ylamino)phenol, CAS No. 991-84-4) ADK STAB PEP-4C (phosphite stabilizer), ADK STAB PEP-8 (3,9-bis(octadecyloxy)-2,4,8,10-tetraoxa-3,9-diphosphaspiro[5.5]undecane, CAS No. 3806-34-6), ADK STAB PEP-8W (mixture of ADK STAB PEP-8 and ADK STAB CA-ST (Calcium stearate lubricant)), ADK STAB PEP-36 (3,9-bis(2,6-di-tert-butyl-4-methylphenoxy)-2,4,8,10-tetraoxa-3,9-diphosphaspiro[5.5]undecane, also known as, cyclicneopentane tetraylbis(2,6-di-t-butyl-4-methylphenyl phosphite), CAS No. 80693-00-1), ADK STAB HP-10 (4,8-di-tert-butyl-2,10-dimethyl-6-(octyloxy)-12H-dibenzo[d,g][1,3,2]dioxaphosphocine, CAS No. 126050-54-2), ADK STAB 2112 (tris(2,4-di-tert-butylphenyl) phosphite, CAS No. 31570-04-4), ADK STAB 1178 (tris(4-nonylphenyl) phosphite, CAS No. 26523-78-4), ADK STAB 1500(tetra$C_{12}$-$C_{15}$alkyl (propane-2,2diylbis(4,1-phenylene)) bis(phosphite), CAS No. 96152-48-6), ADK STAB C (octyl diphenyl phosphite, CAS No. 15647-08-2), ADK STAB 135A (decyl diphenyl phosphite CAS No. 26544-23-0), ADK STAB 3010(tris(decyl) phosphite, CAS No. 25448-25-3), IRGAFOS 12 (tris[2-[[2,4,8,10-tetra-tert-butyldibenzo[d,f][1,3,2]dioxaphosphepin-6-yl]oxy]ethyl]-amine, CAS No. 80410-33-9), IRGAFOS 38 (bis(2,4-di-tert-butyl-6-methylphenyl)-ethyl-phosphite, CAS No. 145650-

60-8), Sumilizer TPL-R (dilauryl 3,3'-thiodipropionate, CAS No. 123-28-4), Sumilizer TPM (dimyristyl 3,3'-thiodipropionate, CAS No. 16545-54-3), Sumilizer TPS (distearyl 3,3'-thiodipropionate, CAS No. 693-36-7), Sumilizer TP-D (pentaerythrityl tetra(betalaurylthiopropionate), CAS No. 29598-76-3), Sumilizer MB (2-mercaptobenzimidazole, CAS No. 583-39-1), ADK STAB AO-412S ((2,2-bis[[3-(dodecylthioh1-oxopropoxy]methyl]propane-1,3-diybis[3-(dodecylthio)propionate])), ADK STAB AO-503 (thioether antioxidant), IRGANOX PS 800FD (didodecyl-3,3'-thiodipropionate, CAS No. 123-28-4) or IRGANOX PS 802FD (dioctadecyl-3,3'-thiodipropionate, CAS No. 693-36-7), where the ADK materials listed above are products of Adeka Corporation, Tokyo, Japan; the Sumilizer materials listed above are products of Sumitomo Chemical Co., Ltd., Tokyo, Japan; and the IRGANOX or IRGAFOS materials listed above are products of Ciba Specialty Chemicals Corp.

Still further, it will be understood that Examples 1 through 12 are non-limiting examples. That is to say that such are provided only to demonstrate that some embodiments in accordance with the present invention have been actually reduced to practice. In view of the disclosure of norbornene-type monomers provided hereinabove, one of ordinary skill will know that the aforementioned examples are not the only possible polymer and/or composition embodiments that can be in accordance with this disclosure.

With regard to methods the utilize polymer compositions embodiments in accordance with the present disclosure, such method embodiments encompass the forming of a desired/appropriate polymer composition and applying or casting such composition over/onto a substrate. Such casting encompasses any appropriate method for applying a polymer composition onto a substrate, for example by a spin coating, a spray coating or a doctor blade method. Further, with regard to film forming embodiments in accordance with the present disclosure, such embodiments encompass a post application bake (PAB) and a curing bake, where the latter is performed at a temperature sufficient to activate the thermal acid generator (TAG) that is present in the polymer composition where such TAG activation initiates crosslinking of the polymer which serves to, among other things, harden the layer/film.

Further to the use of the layer/film embodiments in accordance with the present disclosure, reference is made to U.S. Pat. No. 7,361,931 which describes that conventional known flat panel displays, including active matrix liquid crystal displays, have a configuration where a thin film transistor (TFT) for switching is provided to each of a number of display pixels. The '931 patent further describes that a masking means (a light shielding means) must be provided to prevent light from entering the TFTs and therefore such masking means results in the substrate having irregularity thereon. One skilled in the art should realize that eliminating or reducing such irregularity is desirable and that embodiments in accordance with the present disclosure can provide such a desirable result. Further, as demonstrated herein, such polymer layer or film embodiments exhibit characteristics of high transparency across the visible light spectrum, excellent thermal stability, resistance to NMP, a solvent common to the manufacture of such displays, and hardness sufficient to avoid or minimize handling induced film or layer defects.

EXAMPLE 1

Polymer Synthesis of MeOAcNB/MGENB (80:20)

MeOAcNB (bicyclo[2.2.1]hept-5-en-2-ylmethyl acetate, 7.87 g, 47.4 mmol) and MGENB (2.13 g, 11.8 mmol) was dissolved in toluene (15.17 g) and MEK (1.17 g) and charged to a reaction vessel. The solution was sparged with nitrogen for 30 min to remove oxygen and then heated to 60° C. Once at temperature, $(\eta^6\text{-toluene})Ni(C_6F_5)_2$ (0.164 g, 0.34 mmol) in 7.00 g of toluene (prepared in a glove box) was added via syringe to the reaction vessel. The mixture was allowed to stir at 60° C. for 4.0 hr, after which the solution was cooled to room temperature. The reaction mixture diluted 50 g of toluene was then treated with an acetic acid (2.65 g, 44.0 mmol) and 30% conc. of $H_2O_2$aq (5.02 g 44.0 mmol) to remove Ni residues and then washed with water. The solvents were removed by rotovaporation to give a light yellow solid. The yellow solid was redissolved in THF (50 wt %) and was added to hexane (20 fold excess) to give a light yellow powder that was filtered and dried by the vacuum at 40° C. for 16 hr. Approximately, 8.6 g (86%) of the MeOAcNB/MGENB polymer was isolated. The molar ratio of MeOAcNB and MGENB was determined to be 80 to 20 by $^{13}C$ NMR.

EXAMPLE 2

Polymer Synthesis of HFANB/$C_4F_9$NB/MGENB (60:20:20)

HFANB (3.13 g, 11.4 mmol), $C_4F_9$NB (1.19 g, 3.8 mmol) and MGENB (0.68 g, 3.8 mmol) was dissolved in toluene (8.85 g) and MEK (0.75 g) and charged to a reaction vessel. The solution was sparged with nitrogen for 30 min to remove oxygen and then heated to 60° C. Once at temperature, $(\eta^6\text{-toluene})Ni(C_6F_5)_2$ (0.184 g, 0.38 mmol) in 5.40 g of toluene (prepared in a glove box) was added via syringe to the reaction vessel. The mixture was allowed to stir at 60° C. for 14.0 hr, after which the solution was cooled to room temperature. The reaction mixture diluted toluene (20 g) and THF (10 g) was then treated with an acetic acid (3.60 g, 60.0 mmol) and 30% $H_2O_2$aq (6.81 g 60.0 mmol) to remove Ni residues and then washed with water. The solvents were removed by rotovaporation to give a light yellow solid. The yellow solid was redissolved in THF (50 wt %) and was added to hexane (20 fold excess) to give a light yellow powder that was filtered and dried by the vacuum at 40° C. for 16 hr. Approximately, 3.48 g (70%) of the HFANB/$C_4F_9$NB/MGENB polymer was isolated.

EXAMPLE 3

Polymer Synthesis of HFANB/$C_4F_9$NB/MGENB (40:40:20)

HFANB (2.08 g, 7.6 mmol), $C_4F_9$NB (2.38 g, 7.6 mmol) and MGENB (0.68 g, 3.8 mmol) was dissolved in toluene (8.85 g) and MEK (0.75 g) and charged to a reaction vessel. The solution was sparged with nitrogen for 30 min to remove oxygen and then heated to 60° C. Once at temperature, $(\eta^6\text{-toluene})Ni(C_6F_5)_2$ (0.184 g, 0.38 mmol) in 5.40 g of toluene (prepared in a glove box) was added via syringe to the reaction vessel. The mixture was allowed to stir at 60° C. for 14.0 hr, after which the solution was cooled to room temperature. The reaction mixture diluted toluene (20 g) and THF (10 g) was then treated with an acetic acid (3.60 g, 60.0 mmol) and 30% $H_2O_2$aq (6.81 g 60.0 mmol) to remove Ni residues and then washed with water. The solvents were removed by rotovaporation to give a light yellow solid. The yellow solid was redissolved in THF (50 wt %) and was added to hexane (20 fold excess) to give a light yellow powder that was filtered and dried by the vacuum at 40° C. for 16 hr. Approximately, 3.60 g (70%) of the polymer was isolated.

EXAMPLE 4

Polymer Synthesis of HFANB/MGENB (80:20)

HFANB (4.30 g, 15.7 mmol) and MGENB (0.70 g, 3.9 mmol) was dissolved in toluene (9.25 g) and MEK (0.75 g) and charged to a reaction vessel. The solution was sparged with nitrogen for 30 min to remove oxygen and then heated to 60° C. Once at temperature, ($\eta^6$-toluene)Ni($C_6F_5$)$_2$ 0.190 g, 0.39 mmol) in 5.00 g of toluene (prepared in a glove box) was added via syringe to the reaction vessel. The mixture was allowed to stir at 60° C. for 7.0 hr, after which the solution was cooled to room temperature. The reaction mixture THF (20 g) was then treated with an acetic acid (3.72 g, 62.0 mmol) and 30% $H_2O_2$aq (7.03 g 60.0 mmol) to remove Ni residues and then washed with water. The solvents were removed by rotovaporation to give a light yellow solid. The yellow solid was redissolved in THF (50 wt %) and was added to hexane (20 fold excess) to give a light yellow powder that was filtered and dried by the vacuum at 40° C. for 16 hr. Approximately, 3.25 g (65%) of the HFANB/MGENB polymer was isolated.

EXAMPLE 5

Polymer Synthesis of MeOAcNB/EONB (80:20)

MeOAcNB (7.51 g, 45.2 mmol) and EONB (2.49 g, 11.3 mmol) was dissolved in toluene (16.00 g) and MEK (2.33 g) and charged to a reaction vessel. The solution was sparged with nitrogen for 30 min to remove oxygen and then heated to 60° C. Once at temperature, ($\eta^6$-toluene)Ni($C_6F_5$)$_2$ 0.156 g, 0.32 mmol) in 5.00 g of toluene (prepared in a glove box) was added via syringe to the reaction vessel. The mixture was allowed to stir at 60° C. for 4.0 hr, after which the solution was cooled to room temperature. The reaction mixture diluted in toluene (30 g) and THF (20 g) was then treated with an acetic acid (3.06 g, 51.0 mmol) and 30% $H_2O_2$aq (5.77 g 51.0 mmol) to remove Ni residues and then washed with water. The solvents were removed by rotovaporation to give a light yellow solid. The yellow solid was redissolved in THF (50 wt %) and was added to hexane (20 fold excess) to give a light yellow powder that was filtered and dried by the vacuum at 40° C. for 16 hr. Approximately, 9.06 g (91%) of the MeOAcNB/EONB polymer was isolated.

EXAMPLE 6

Polymer Synthesis of EPENB/MGENB (80:20)

EPENB (4.66 g, 24.0 mmol) and MGENB (1.32 g, 6.0 mmol) was dissolved in toluene (12.00 g) and MEK (0.9 g) and charged to a reaction vessel. The solution was sparged with nitrogen for 30 min to remove oxygen and then heated to 60° C. Once at temperature, ($\eta^6$-toluene)Ni($C_6F_5$)$_2$ (0.073 g, 0.15 mmol) in 5.00 g of toluene (prepared in a glove box) was added via syringe to the reaction vessel. The mixture was allowed to stir at 60° C. for 5.0 hr, after which the solution was cooled to room temperature. The reaction mixture diluted in toluene (10 g) and THF (6 g) was then treated with an acetic acid (1.4 g, 23.3 mmol) and 30% $H_2O_2$aq (2.7 g 23.8 mmol) to remove Ni residues and then washed with water. The solvents were removed by rotovaporation to give a light yellow solid. The yellow solid was redissolved in THF (50 wt %) and was added to hexanes (20 fold excess) to give a white powder that was filtered and dried by the vacuum at 40° C. for 16 hr. Approximately, 4.1 g (70%) of the EPENB/MGENB polymer was isolated (GPC Mw=78,400 Mn=44,000).

The yield, Mw and Mn for each of the polymerization examples provided above are summarized in Table 1, below. Mn and Mw are determined by a standard GPC technique using a polystyrene standard.

TABLE 1

| | Polymer Examples | | | | | |
|---|---|---|---|---|---|---|
| | Ex 1 | Ex 2 | Ex 3 | Ex 4 | Ex 5 | Ex. 6 |
| Polymerization Yield (%) | 86 | 70 | 70 | 65 | 91 | 70 |
| Mw | 45700 | 26400 | 18500 | 28300 | 41800 | 78400 |
| Mn | 30700 | 14800 | 13000 | 16400 | 23700 | 44000 |

In the composition examples that follow, Examples 7-12, three specific antioxidant/synergist materials are used. The manufacturer of each material as well as the material's chemical name is provided the first time each is used in the examples below, thereafter only the manufacturer's trade designation was provided.

While each polymer composition, of Examples 7-12, encompasses the same three antioxidant/synergist components it should be understood that as such examples are non-limiting, the use of these specific components is illustrative only and should be understood only to indicated that for the type of thermal and optical stability exhibited by film embodiments of the present disclosure, the use of more than one type of antioxidant/synergist is advantageous, where such types of antioxidants/synergists encompass phenolics, phosphites, thioethers and mixtures thereof.

Notwithstanding, the selection of such specific antioxidant/synergist components was made on the basis of the results shown in the experimental matrix of Table 2. For each composition 1-22, the base polymer was a MeOAcNB homopolymer cast onto a glass wafer to form a 3 μm film as measured after a post application bake (PAB) at 110° C. for 100 sec. A measurement of the % transparency of the twenty-two 3 um films, nineteen sample compositions (with the additives indicated) and three control compositions (with no additives) was made at 400 nm after each film was heated for 30 minutes at 280° C. and a selection of the specific three additive package was made

TABLE 2

| | Additive-A | | Additive-B | | C | | 400 nm, 3 um FT Transparency |
|---|---|---|---|---|---|---|---|
| Exp No. | type | phr | type | phr | type | phr | (%) |
| 1 | — | | — | | — | | 18.4 |
| 2 | AO-30 | 1 | PEP-36 | 1 | — | | 41.4 |
| 3 | AO-40 | 1 | HP-10 | 1 | — | | 23.1 |
| 4 | AO-60 | 1 | PEP-36 | 1 | — | | 50.1 |
| 5 | AO-80 | 1 | HP-10 | 1 | — | | 38.4 |
| 6 | AO-30 | 1 | HP-10 | 1 | — | | 34.5 |

TABLE 2-continued

| Exp No. | Additive-A type | phr | Additive-B type | phr | C type | phr | 400 nm, 3 um FT Transparency (%) |
|---|---|---|---|---|---|---|---|
| 7 | AO-40 | 1 | PEP-36 | 1 | — | — | 19.6 |
| 8 | AO-60 | 1 | HP-10 | 1 | — | — | 67.9 |
| 9 | AO-80 | 1 | PEP-36 | 1 | — | — | 63.8 |
| 10 | — | — | — | — | — | — | 6.5 |
| 11 | AO-60 | 3 | PEP-36 | 3 | — | — | 65.5 |
| 12 | AO-80 | 3 | PEP-36 | 3 | — | — | 25 |
| 13 | AO-20 | 3 | PEP-36 | 3 | — | — | 12.2 |
| 14 | AO-330 | 3 | PEP-36 | 3 | — | — | 26.7 |
| 15 | AO-60 | 3 | HP-10 | 3 | — | — | 59.2 |
| 16 | AO-80 | 3 | HP-10 | 3 | — | — | 39 |
| 17 | AO-20 | 3 | HP-10 | 3 | — | — | 16.6 |
| 18 | AO-330 | 3 | HP-10 | 3 | — | — | 25.4 |
| 19 | — | — | — | — | — | — | 10.2 |
| 20 | AO-60 | 3 | PEP-36 | 3 | — | — | 63.5 |
| 21 | AO-60 | 3 | PEP-36 | 3 | AO-412S | 1 | 79.9 |
| 22 | AO-60 | 3 | PEP-36 | 3 | AO-412S | 3 | 96 |

It is of course understood by one skilled in the art that the specific additive package used in each of Examples 7-12, below is provided for illustrative purposes only. That is to say that the selection of such a successful package based on a small experimental design, illustrates that another antioxidant/synergist additive package can be readily determined without the need for undue experimentation. Any such alternate packages being the result of the teachings provided herein, it will be understood that they are with the scope of the embodiments of the present disclosure.

EXAMPLES 7-12

Preparation of Thermally Curable Composition

For each of Examples 7 through 12, 2.0 g of the polymer obtained from Examples 1 through 6, respectively, was used to prepare a 17 weight percent (wt %) polymer solution in PGMEA. The formulation additives listed below, each in the amount indicated, were then added to and dissolved in the polymer solution, however, for Example 12, after which and the solution was filtered through a 1 micron syringe filter.

For each example, SI-150L was added as 0.08 g of a 50 wt % GBL solution, where SI-150L is the trade name of Sanshin Chemical Industry CO., LTD. for (dimethyl-p-acetoxysulfoniumhexafluoro antimonate). For each of the antioxidant/synergist additives, the amount, in grams, added for each additive is indicated in Table 3, below. The additives used were ADK STAB AO-60, the trade name of ADEKA CORPORATION for (pentaerythritol tetrakis{3-(3,5-di-tert-butyl-4-hydroxyphenyl)propionate}); ADK STAB PEP-36 the trade name of ADEKA CORPORATION for (3,9-Bis(2,6-di-tert-butyl-4-methyl phenoxy)-2,4,8,10-tetraoxa-3,9-diphosphaspiro(5.5)undecane; and ADEKA SATB AO-412S the trade name of ADEKA CORPORATION for (2,2-bis[[3-(dodecylthio)-1-oxopropoxy]methyl]propane-1,3-diylbis[3-(dodecylthio)propionate]).

TABLE 3

| Additive | Ex. 7 | Ex. 8 | Ex. 9 | Ex. 10 | Ex. 11 | Ex. 12 |
|---|---|---|---|---|---|---|
| AO-60 | 0.1 | 0.06 | 0.06 | 0.06 | 0.1 | 0.06 |
| PEP-36 | 0.03 | 0.06 | 0.06 | 0.06 | 0.03 | 0.03 |
| AO-412S | 0.1 | 0.06 | 0.06 | 0.06 | 0.1 | 0.06 |

Evaluation Procedure for the Cured Material

Each of the thermally curable compositions exemplified above were evaluated with regard to Transparency, Thermal Stability, Pencil Hardness and NMP tolerance. The general procedure for each evaluation test is provided below with the evaluation test results provided in Table 4.

Transparency

Each formulated solution was spun-cast onto a glass wafer to form a 3 um film. After casting, the film received a post application bake (PAB) at 110° C. for 100 sec. Transparency at 400 nm was measured before and after thermal treatment in air at 280° C. for 30 min.

Thermal Stability

Each formulated solution was spun-cast onto a 4 inch silicon wafer to form a 3 μm film. After casting, the film received a post application bake (PAB) at 110° C. for 100 sec and a subsequent cure bake, performed in air for 30 min at 250° C. A portion of the cured film was scratched off the silicon wafer and a TG/DTA analysis performed thereon. The measurement condition was 10° C. per minute temperature ramp under $N_2$ flow and the result is provided as the temperature where 1% weight loss was observed.

Pencil Hardness

Each formulated solution was spun-cast onto a 4 inch silicon wafer to form a 3 μm film. After casting, the film received a post application bake (PAB) at 110° C. for 100 sec and a subsequent cure bake, performed in air for 30 min at 250° C. After the cure bake, a pencil hardness test was performed using the procedure of ASTM D3363 except for the absence of specific temperature and humidity control, ambient (at the time of testing) temperature and humidity control was employed.

NMP (N-Methylpyrrolidone) Tolerance

Each formulated solution was spun-cast onto a 4 inch silicon wafer to form a 3 μm film. After casting, the film received a post application bake (PAB) at 110° C. for 100 sec and a subsequent cure bake, performed in air for 30 min at 250° C. After the cure bake the film thickness was measured, the film soaked in NMP at 40° C. for 10 min and the film thickness remeasured. The difference in film thick was recorded as percent film thickness loss.

TABLE 4

| Evaluation Examples | | | | | | |
|---|---|---|---|---|---|---|
| Test | Ex. 7 | Ex. 8 | Ex. 9 | Ex. 10 | Ex 11 | Ex. 12 |
| Transparency before Heating (%) | 100 | 100 | 100 | 100 | 100 | 100 |
| Transparency (after 280° C. for 30 min) (%) | 98 | 100 | 100 | 100 | 100 | 97 |
| 1% weight loss temperature (° C.) | 297 | 290 | 295 | 290 | 308 | 313 |
| Pencil hardness | 4H | 4H | 4H | 4H | 6H | 4H |
| NMP tolerance* (%) | <1.0 | <1.0 | <1.0 | 12 | <1.0 | <1.0 |

*calculated with after/before film thickness

By now it should be realized that the polymer, polymer composition and polymer layer embodiments that have been described are useful for forming layers capable of meeting the requirements for transparent layers employed in the manufacture of liquid crystal displays, organic light emitting diode displays and other optoelectronic devices.

The invention claimed is:

1. A layer forming polymer consisting essentially of a first type of norbornene-type repeating unit and a second type of norbornene-type repeating unit each represented by Formula A, such types of repeating units derived from norbornene-type monomers represented by Formula A1:

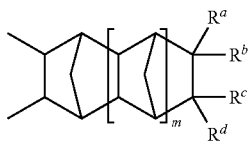

A

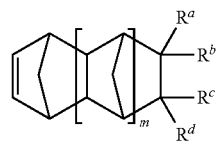

A1 where m is 0, 1 or 2, at least one of $R^a$, $R^b$, $R^c$, and $R^d$ for said first type of repeating unit is a crosslinkable hydrocarbyl pendent group selected from the group consisting, of Formulae B and C:

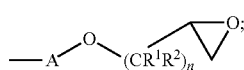

(B)

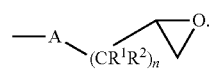

(C)

where n is an integer from 1 to 4, A is an optional linking group selected from the group consisting of methylene and a $C_2$ to $C_6$ alkylene, $R^1$ and $R^2$ are each independently selected from the group consisting of hydrogen, methyl and ethyl;

and at least one of $R^a$, $R^b$, $R^c$ and $R^d$ for said second type of repeating unit is distinct from said first type of repeating unit and is a hydrocarbyl pendent group, where said hydrocarbyl pendent group is selected from the group consisting of Formulae E, F, G and H:

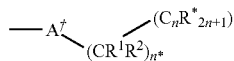

E

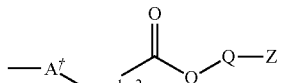

F

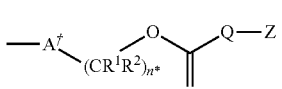

G

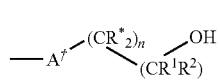

H where $A^\dagger$, if present, is a linking group selected from the group consisting of methylene, a $C_2$ to $C_3$ alkylene and a $C_2$ to $C_6$ ether, for Formula E, $R^*$, $R^1$ and $R^2$ are each fluorine and for Formulae F, G and H each $R^*$ is hydrogen or fluorine, $R^1$ and $R^2$ are each independently selected from the group consisting of hydrogen, fluorine, methyl, perfluoromethyl, ethyl and perfluoroethyl, n is an integer from 1 to 6 and n* is an integer from 0 to 3, Z is selected, from the group consisting of $(C_nR^*_{2n+1})$, and $(CR^*_2)_n(CR^1R^2)_nOH$, Q, if present, is selected from a $C_2$ to $C_9$ alkylene;

and the remaining $R^a$, $R^b$, $R^c$ and $R^d$ are independently selected from the group consisting of hydrogen and $C_1$-$C_6$alkyl; and wherein said polymer having at least 95% transmission of its initial transparency at 400 nm after exposure of a 3 μm film of said polymer to thermal treatment in air at 280° C. for 30 minutes.

2. The layer forming polymer of claim 1 where for said first type of repeating unit, one of $R^a$, $R^b$, $R^c$ and $R^d$ is a crosslinkable hydrocarbyl pendent group represented by one of Formulae B and C:

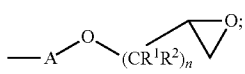

(B)

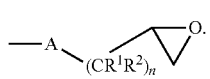

(C)

where n is 1 or 4, A is selected from methylene and $C_2$ alkylene linking group, and $R^1$ and $R^2$ are each hydrogen.

3. The layer forming polymer of claim 2 where the crosslinkable pendent group is represented by B:

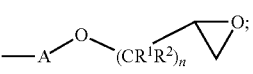

(B)

where n is 1, A is methylene, and $R^1$ and $R^2$ are hydrogen.

4. The layer forming polymer of claim 1 where for said second type of repeating unit, one of $R^a$, $R^b$, $R^c$ and $R^d$ is a hydrocarbyl pendent group selected from the group consisting of Formulae E, G and H and the others of $R^a$, $R^b$, $R^c$ and $R^d$ are hydrogen:

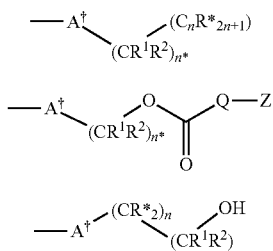

where A†, if present, is a linking group selected from methylene and $C_2$ alkylene, each R* is fluorine, $R^1$ and $R^2$ are each independently selected from fluorine, methyl, perfluoromethyl, ethyl and perfluoroethyl, n is 1, 2 or 3 and n is an integer from 0 to 2, Z is selected from methyl or ethyl and Q is absent.

5. The layer forming polymer of claim 4 where the hydrocarbyl pendent group is represented by Formula E, where each R*, $R^1$ and $R^2$ are fluorine:

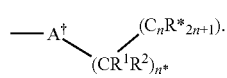

E

6. The layer forming polymer of claim 4 where the hydrocarbyl pendent group is represented by Formula H, where n is 1, 2 or 3, $R^1$ and $R^2$ are each —$CF_3$ and each R* is hydrogen:

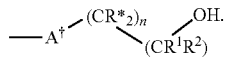

H

7. The layer forming polymer of claim 1 where the crosslinkable pendent group is represented by Formula 1 and the hydrocarbyl pendent group is represented by Formula 2:

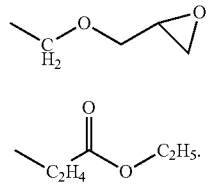

1

2

8. The layer forming polymer of claim 1 where the crosslinkable pendent group is represented by Formula 1 and the hydrocarbyl pendent group is represented by Formula 3:

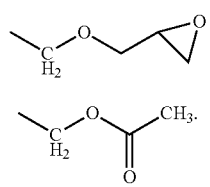

1

3

9. The layer forming polymer of claim 1 where the crosslinkable pendent group is represented by Formula 1 and the hydrocarbyl pendent group is represented by Formula 4:

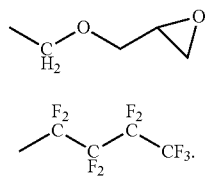

1

4

10. The layer forming polymer of claim 1 where the crosslinkable pendent group is represented by Formula 1 and the hydrocarbyl pendent group is represented by Formula 5:

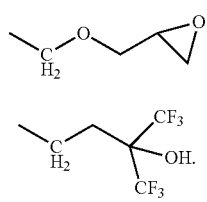

1

5

11. The layer forming polymer of claim 1 where the crosslinkable pendent group is represented by Formula 6 or Formula 7:

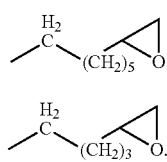

6

7

12. The layer forming polyiner of claim 1 consisting essentially of a first type of repeating unit having a crosslinkable pendent group selected from the groups represented by Formulae 1, 6 and 7:

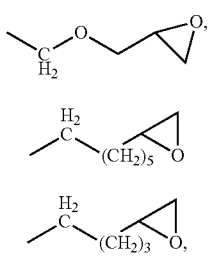

1

6

7 a second type of repeating unit selected from the pendent groups represented by Formulae 2, 3, 4 and 5:

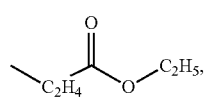

2

19

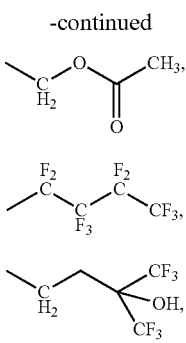

and further containing a third type of repeating unit, distinct from said second type of repeating unit, also selected from the pendent groups represented by Formulae 2, 3, 4 and 5.

13. A layer forming composition comprising the layer forming polymer of claim 1 and a casting solvent.

14. The layer forming composition of claim 13 where said casting solvent is selected from one or more of N-methylpyrrolidone (NMP), Gamma-Butyrolactone (GBL), N,N-dimethylacetamide (DMA), dimethyl sulfoxide (DMSO), diethylene glycol dimethyl ether, diethylene glycol dibutyl ether, propylene glycol monomethyl ether (PGME), propylene glycol monomethyl ether acetate (PGMEA), methyl lactate, ethyl lactate, butyl lactate, methyl ethyl ketone and cyclohexanone.

15. The layer forming composition of claim 13 further comprising a thermal acid generator (TAG) and an antioxidant/synergist additive.

16. The layer forming composition of claim 15 where the thermal acid generator is selected from the group consisting of dimethyl(p-acetoxyphenyl)sulfonium hexafluoroantimonate, benzyl(p-hydroxyphenyl)methylsulfonium hexafluoroantimonate and 1-naphtylmethyl(p-hydroxyphenyl)methylsulfonium hexafluoroantimonate.

17. The layer forming composition of claim 15 where said antioxidant/synergist additive is selected from the group consisting of:
1,3,5-tris(3,5-di-tert-butyl-4-hydroxybenzyl)-1,3,5-triazinane-2,4,6-trione,
4,4',4"-(butane-1,1,3-triyl)tris(2-(tert-butyl)-5-methylphenol),
4,4'-(butane-1,1-diyl)bis(2(tert-butyl)-5methylphenol),
octadecyl3-(3,5-di-tert-butyl-4-hydroxyphenyl)propionate,
tetrakis[methylene-3-(3',5'-di-t-butyl-4-hydroxyphenyl) propionate]methane,
2,4,8,10-tetraoxaspiro[5,5]undecane-3,9-diylbis(2-methylpropane-2,1diyl) bis(3-(3-(tert-butyl)-4-hydroxy-5-methylphenyl)propanoate,
3,3",5,5"-tetra-tert-butyl-5'-(3,5-di-tert-butyl-4-hydroxyphenyl)-2',4',6'-trimethyl-[1,1':3',1"-terphenyl]-4,4"-diol,
2-tert-butyl-6-(3-tert-butyl-2-hydroxy-5-methylbenzyl)-4-methylphenyl acrylate,
2-[1-(2hydroxy-3,5-di-tert-pentylphenyl)ethyl]-4,6-di-tert-pentylphenyl acrylate,
3,9-bis[2-[3(3tert-butyl-4-hydroxy-5-methylphenyl)propionyoxy]-1,1-dimethylethyl]-2,4,8,10-tetraoxaspiro[5.5]undecane,
2,2'-methylenebis(6-tert-butyl-4-methylphenol),
4,4'-butylidenebis(6tert-butyl-3-methylphenol),
4,4'-thiobis(6-tert-butyl-3-methylphenol,

20 thiodiethylene bis[3-(3,5-di-tert-butyl-4-hydroxyphenyl) propionate],
N,N'-hexane-1,6-diylbis(3-(3,5-di-tert-butyl-4-hydroxyphenylpropionamide)),
benzenepropanoic acid, 3,5-bis(1,1-dimethyl-ethyl)-4-hydroxy-$C_7$-$C_9$ branched alkyl esters,
4,6-bis(dodecylthiomethyl)-o-cresol, (calcium phosphonate),
2-methyl-4,6bis(octylsulfanylmethyl)-phenol,
triethylene glycol bis(3-tert-butyl-4-hydroxy-5-methylphenyl)propionate,
1,6-hexamethylene bis(3,5-di-tert-butyl-4-hydroxyhydrocinnamate,
2,6-di-tert-butyl-4-(4,6-bis(octylthio)-1,3,5-triazin-2-ylamino)phenol, (phosphite stabilizer),
3,9bis(octadecyloxy)-2,4,8,10-tetraoxa-3,9-dophosphaspiro[5.5]undecane, calcium stearate lubricant,
cyclieneopentane tetraylbis(2,6-di-t-butyl-4-methylphenyl phosphite),
4,8-di-tert-butyl-2,10-dimethyl-6-(octyloxy)-12H-dibenzo[d,g][1,3,2]dioxaphosphocine,
tris(2,4-di-tert-butylphenyl)phosphite,
tris(4-nonylphenyl)phosphite,
tetra$C_{12}$-$C_{15}$alkyl (propane-2,2diylbis(4,1-phenylene))bis(phosphite),
octyl diphenyl phosphite,
decyl diphenyl phosphite,
tris(decyl)phosphite,
tris[2-[[2,4,8,10-tetra-tert-butyldibenzo[d,f,][1,3,2]dioxaphosphepin-6-yl]oxy]ethyl]-amine,
bis(2,4-di-tert-butyl-6-methylphenyl)-ethyl-phosphite,
dilauryl 3,3'-thiodipropionate,
dimyristyl 3,3'-thiodipropionate,
distearyl 3,3'-thiodipropionate,
(penaerythrityl tetra(betalaurylthioproionate),
2-mercaptobenzimidazole,
2,2-bis[[3-(dodecylthio)-1-oxopropoxy]methyl]propane-1,3-diylbis[3-(dodecylthio)propionate], and thioether antioxidant, or a mixture in any combination thereof.

18. A layer forming composition comprising a norbornene-type polymer, a thermal acid generator, cyclieneopentane tetraylbis(2,6-di-t-butyl-4-methylphenyi phosphite), tetrakis[methylene 3-(3',5'-di-t-butyl-4-hydroxyphenyl) propionate] methane and pentaerythrityltetra(betalaurylthiopropionate).

19. The layer forming composition of claim 18, where said norbornene-type polymer comprises repeating units derived from:

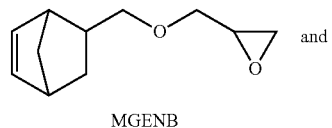

MGENB

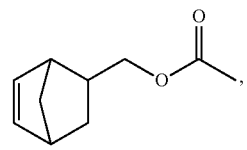

MeAcONB and where
said thermal acid generator is selected from dimethyl(p-acetoxyphenyl)sulfonium antimonate, benzyl(p-hydroxyphenyl)methylsulfonium hexafluoroantimonate and 1-naphthylmethyl(p-hydroxyphenyl)methylsulfonium hexafluoroantimonate.

20. The layer forming composition of claim 19, where said thermal acid generator is dimethyl(p-acetoxyphenyl)sulfonium antimonate.

21. The layer forming composition of claim 18, where said norbornene-type polymer comprises repeating units derived from:

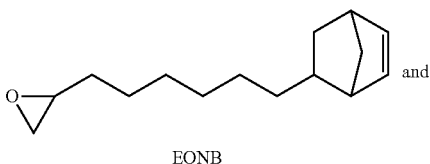

EONB

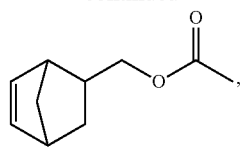

MeAcONB and where
said thermal acid generator is selected from dimethyl(p-acetoxyphenyl)sulfonium antimonite, benzyl(p-hydroxyphenyl)methylsulfonium hexafluoroantimonate and 1-naphthylmethyl(p-hydroxyphenyl)methylsulfonium hexafluoroantimonate.

22. The layer forming composition of claim 21, where said thermal acid generator is dimethyl(p-acetoxyphenyl)sulfonium antimonate.

* * * * *